United States Patent
Lu et al.

(10) Patent No.: US 8,214,773 B2
(45) Date of Patent: Jul. 3, 2012

(54) METHODS FOR E-BEAM DIRECT WRITE LITHOGRAPHY

(75) Inventors: Lee-Chung Lu, Taipei (TW); Yi-Kan Cheng, Taipei (TW); Ru-Gun Liu, Hsin-Chu (TW); Chih-Ming Lai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 253 days.

(21) Appl. No.: 12/617,470

(22) Filed: Nov. 12, 2009

(65) Prior Publication Data

US 2010/0205577 A1  Aug. 12, 2010

Related U.S. Application Data

(60) Provisional application No. 61/151,753, filed on Feb. 11, 2009.

(51) Int. Cl.
*G06F 17/50* (2006.01)

(52) U.S. Cl. ............... 716/54; 716/50; 716/51; 716/55; 716/119; 716/126

(58) Field of Classification Search .................... 716/50, 716/51, 55, 119, 126
See application file for complete search history.

(56) References Cited

U.S. PATENT DOCUMENTS

| | | | |
|---|---|---|---|
| 4,694,178 A | 9/1987 | Harte | |
| 4,974,736 A | 12/1990 | Okunuki et al. | |
| 5,607,801 A | 3/1997 | Nozue | |
| 6,376,307 B1* | 4/2002 | Kim | 438/257 |
| 6,883,158 B1* | 4/2005 | Sandstrom et al. | 430/5 |
| 2008/0116398 A1* | 5/2008 | Hara et al. | 250/492.22 |
| 2009/0282380 A1* | 11/2009 | Chadwick et al. | 716/9 |

* cited by examiner

*Primary Examiner* — Vuthe Siek
*Assistant Examiner* — Brian Ngo
(74) *Attorney, Agent, or Firm* — Slater & Matsil, L.L.P.

(57) ABSTRACT

A method of forming integrated circuits for a wafer includes providing an E-Beam direct write (EBDW) system. A grid is generated for the wafer, wherein the grid includes grid lines. An integrated circuit is laid out for the wafer, wherein substantially no sensitive features in the integrated circuit cross the grid lines of the grid. An EBDW is performed on the wafer using the EBDW system.

26 Claims, 4 Drawing Sheets

METHODS FOR E-BEAM DIRECT WRITE LITHOGRAPHY

This application claims the benefit of U.S. Provisional Application No. 61/151,753 filed on Feb. 11, 2009, entitled "Design Methods for E-Beam Direct Write Lithography," which application is hereby incorporated herein by reference.

TECHNICAL FIELD

This invention relates generally to integrated circuit formation processes, and more particularly to methods for laying out integrated circuits that will be formed using E-Beam direct write lithography.

BACKGROUND

E-Beam direct write (EBDW) is a technology for defining patterns in integrated circuits, which includes using e-beams instead of light to define the patterns. The EBDW may beat the diffraction limit of light and is a good candidate for making small features for future generations of integrated circuits.

Although having great potential, the EBDW has its own limitations in throughput and pattern fidelity. Although solutions have been proposed to address the throughput and pattern fidelity issues, the solutions were often costly. Therefore, the above-mentioned problems have resulted in the delay of the available timeline for putting the EBDW into production.

In an EBDW system, a layout of an integrated circuit is first fractured into stripes, which are further divided into fields and sub-fields. When a layout feature crosses boundaries between stripes, fields, or sub-fields, special care must be taken to avoid patterning errors such as stitching errors and overlay errors. Such special care is necessary for improving the feature fidelity and for reducing the edge roughness.

Conventionally, the patterning-error problems may be solved by moving the stages, on which wafers are placed, slowly in a back-and-forth manner, and/or performing multiple-exposures to the patterns crossing the boundaries with each of the multiple-exposures having an equally divided dose. Unfortunately, the already low throughput of EBDW is further worsened by such a back-and-forth movement and by the multiple exposures. In addition, it is always challenging and costly to control the quality of the features crossing the boundaries, as any degradation in quality may result in critical dimension (CD) uniformity and device performance problems. What is needed, therefore, is a method and structure for overcoming the above-described shortcomings in the prior art.

SUMMARY OF THE INVENTION

In accordance with one aspect of the present invention, a method of forming integrated circuits for a wafer includes providing an E-Beam direct write (EBDW) system. A grid is generated for the wafer, wherein the grid includes grid lines. An integrated circuit is laid out for the wafer, wherein substantially none of the sensitive features in the integrated circuit crosses the grid lines of the grid. An EBDW is performed on the wafer using the EBDW system.

In accordance with another aspect of the present invention, a method of forming integrated circuits for a wafer includes providing an EBDW system; determining a first grid comprising grid lines, wherein the first grid is synchronized with a second grid of the EBDW system; applying the first grid on the wafer; and laying out a circuit for the wafer. A first boundary and a second boundary of the circuit overlap a first grid line of the first grid and a second grid line of the first grid perpendicular to the first grid line, respectively. An EBDW is performed on the wafer using the EBDW system.

In accordance with yet another aspect of the present invention, a method of forming integrated circuits for a wafer includes providing an EBDW system; determining a first grid comprising grid lines, wherein the first grid is synchronized with a second grid of the EBDW system; applying the first grid on the wafer; and performing an automatic placement using a placer. The placer is applied with a constraint to place non-sensitive standard cells on the grid lines of the first grid, and not to place sensitive standard cells on the grid lines of the first grid.

The advantageous features of the present invention include improved throughput in the EBDWs and improved fidelity in the features formed using the EBDWs.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

Figure 1:
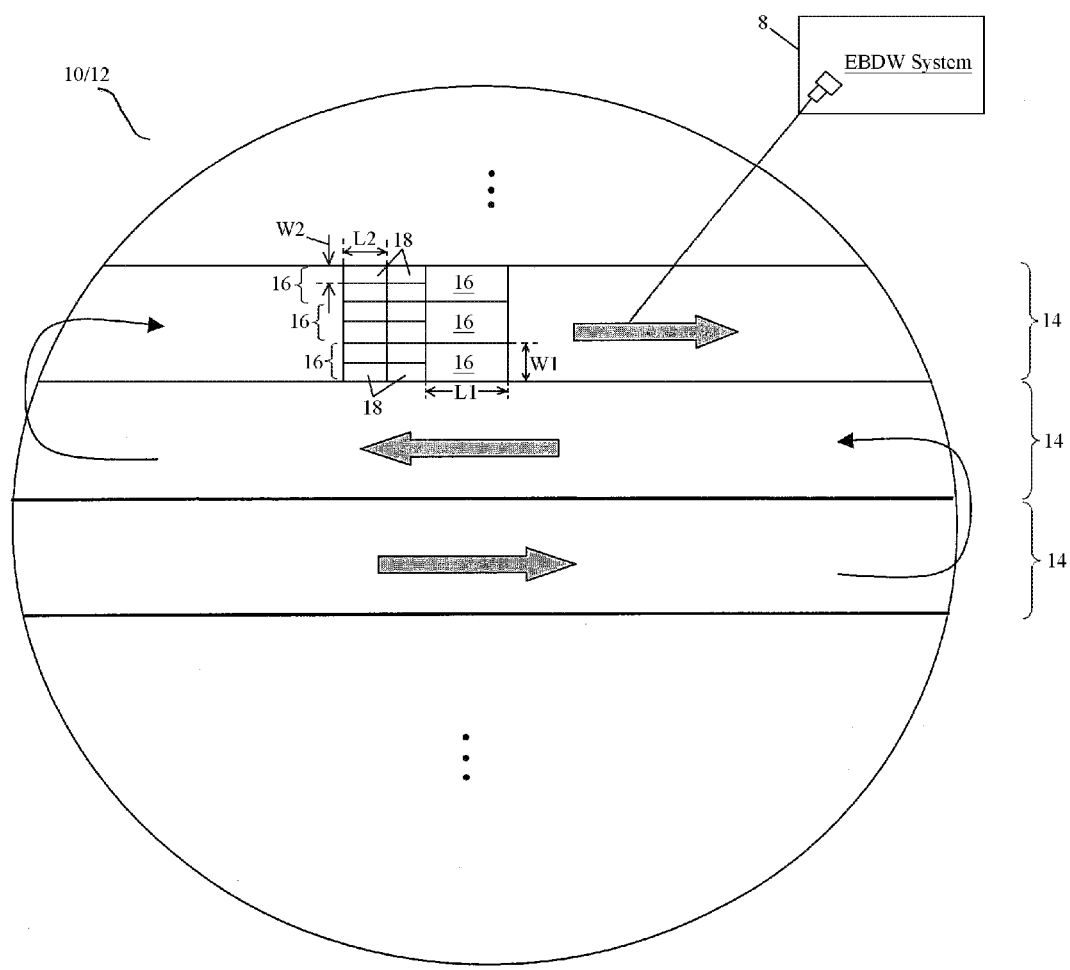
FIG. 1 illustrates a grid of an E-Beam direct write (EBDW) system.

FIG. 1 illustrates a top view of a portion of wafer 10, on which an E-Beam direct write (EBDW) is performed. In an embodiment, the EBDW is performed on photo resist 12 formed over, and hence overlapping, wafer 10. By scanning certain patterns in photo resist 12 with the e-beam, the scanned patterns of photo resist 12 have a different characteristic from the remaining portions not scanned with the e-beam. Accordingly, photo resist 12 may be developed and the patterns may be transferred to the underlying features.

In an embodiment, EBDW system (tool) 8, which is symbolized in FIG. 1, has the internal setting of stripes, fields, and possibly sub-fields, and may use the internal setting to divide wafer 10 into multiple stripes 14 parallel to each other and having an equal width. EBDW system 8 may scan wafer 10 stripe-by-stripe, for example, in the directions show in FIG. 1. Each of stripes 14 may be further divided into a plurality of fields 16 in the form of a grid, with each of fields 16 having the same dimensions (length L1 and width W1) as others. Optionally, each of fields 16 may further be divided into a plurality of sub-fields 18, which are also in the form of grids, with each of sub-fields 18 having the same dimensions (length L2 and width W2) as others. Accordingly, the boundaries between stripes 14 are most likely to fall on the boundaries between neighboring fields 16, while the boundaries between fields 16 are most likely to fall on the boundaries between neighboring sub-fields 18. Throughout the description, the term "EBDW region" may be used as a generic term to refer to stripes, fields, and sub-fields, while the term "boundary" may refer to the boundary between any two neighboring regions, unless specified otherwise. The boundaries of stripes, fields, and sub-fields form grids, which are referred to as EBDW grids hereinafter, and the boundaries of the EBDW regions are referred to grid lines (23, not shown in FIG. 1, please refer to FIG. 2) of the EBDW grids. In an embodiment, EBDW system 8 is a single-e-Beam-direct-write system that can emit only one e-beam at a time. In alternative embodiments, EBDW system 8 is a multiple-e-Beam-direct-write system that can emit multiple e-beams at a same time, wherein the simultaneous projection of multiple e-beams may improve the throughput.

Figure 2:
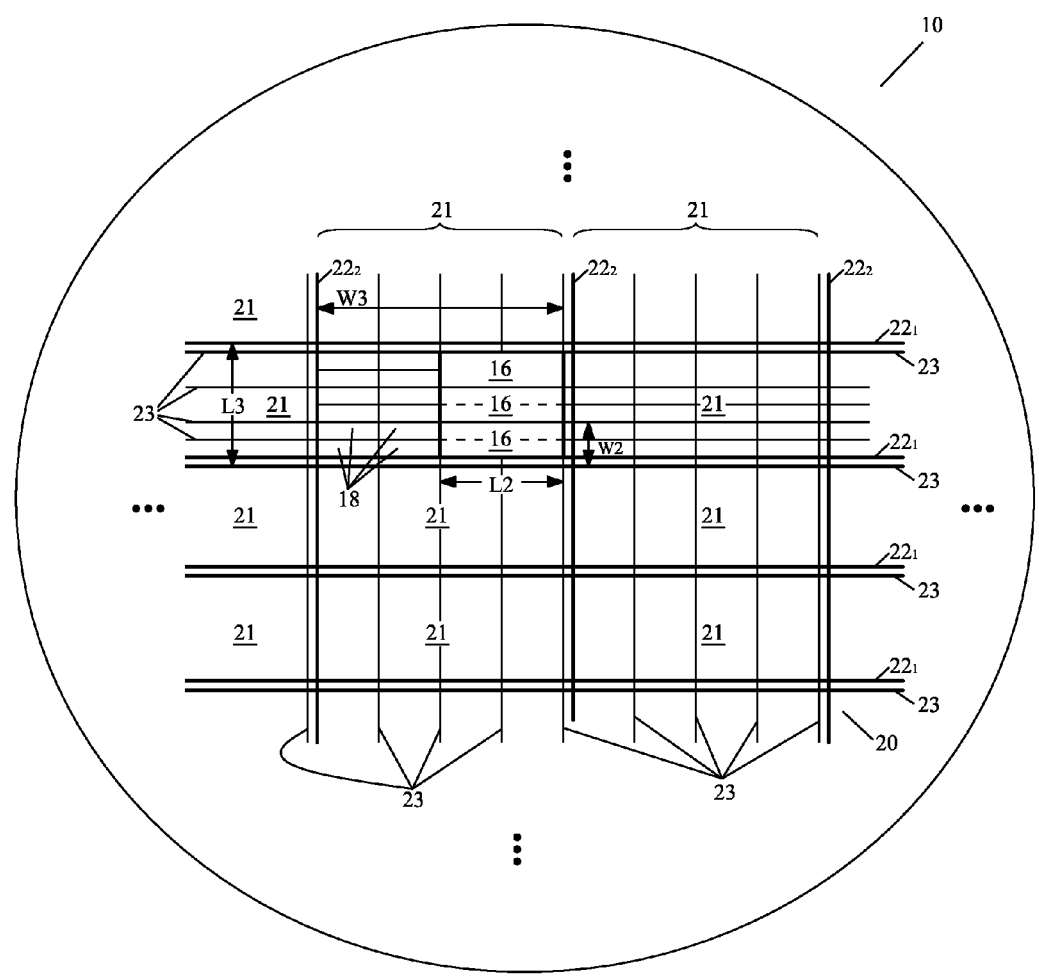
FIG. 2 illustrates a top view of a grid on a wafer, wherein the grid on the wafer is synchronized with the grid of the EBDW system.

In an embodiment, in the design of the integrated circuits in wafer 10, grid 20 is formed as a guide to constraint how the layout, placement, and routing of the integrated circuits may be performed, as is shown in FIG. 2. Grid lines 22 (denoted as $22_1$ and $22_2$) of grid 20 are synchronized with the stripe boundaries of stripes 14 (not shown), fields 16, and/or sub-fields 18. Please note that grid 20 is the concept related to the design (layout) of the integrated circuits in wafer 10, while the EBDW grids are the internal setting of the EBDW system and is only related to grid 20 when the directed e-beam write is performed. Throughout the description, grid 20 is referred to as being "synchronized" with the EBDW grids if grid lines 22 of grid 20 may fully overlap some of grid lines 23 in the EBDW grids. For a clear view, grid lines 22 are shown as being slightly separated from grid lines 23 of the EBDW grids, although in a real situation, grid lines 22 may accurately overlap some of grid lines 23 of the EBDW grids at the time the EBDW is performed to wafer 10. In an embodiment, width W3 and length L3 of each grid cell 21 in grid 20 is an integer times the width W2 and length L2 of sub-fields 18, respectively. The locations of grid lines 22 may be selected according to the characteristics of the EBDW system, and may fall on the boundary lines (of stripes, fields, sub-fields) where EBDW-related errors (such as stitching errors or overlay errors) are more likely to occur. Inside each grid cell 21, even though there may be (or may not be) boundaries of the EBDW regions (stripes, fields, or sub-fields), the errors are unlikely to occur. Grid cells 21 may be defined as great as possible, providing that substantially no EBDW-related errors occur inside each grid cell 21. Therefore, grid 20 may be custom designed for the respective EBDW system that will be used to perform the EBDW on the wafers.

In an embodiment, grid lines 22 fall on the boundaries (referred to as sub-field-only boundaries hereinafter) between neighboring sub-fields 18, but not on the boundaries between neighboring fields 16. Please note that each of the sub-field boundaries may extend all the way from one side of wafer 10 to the other side. In alternative embodiments, grid lines 22 fall on the boundaries (referred to as field-only boundaries hereinafter) between neighboring fields 18, but not on the boundaries between neighboring stripes 14. In yet other embodiments, grid lines 22 fall on the boundaries (referred to as stripe boundaries hereinafter) between neighboring stripes 14. In yet other embodiments, grid lines $22_1$ and $22_2$ fall on different types of boundaries including sub-field-only boundaries, field-only boundaries, and stripe boundaries, and hence width W3 of grid 20 may not be equal to length L3.

Figure 3:
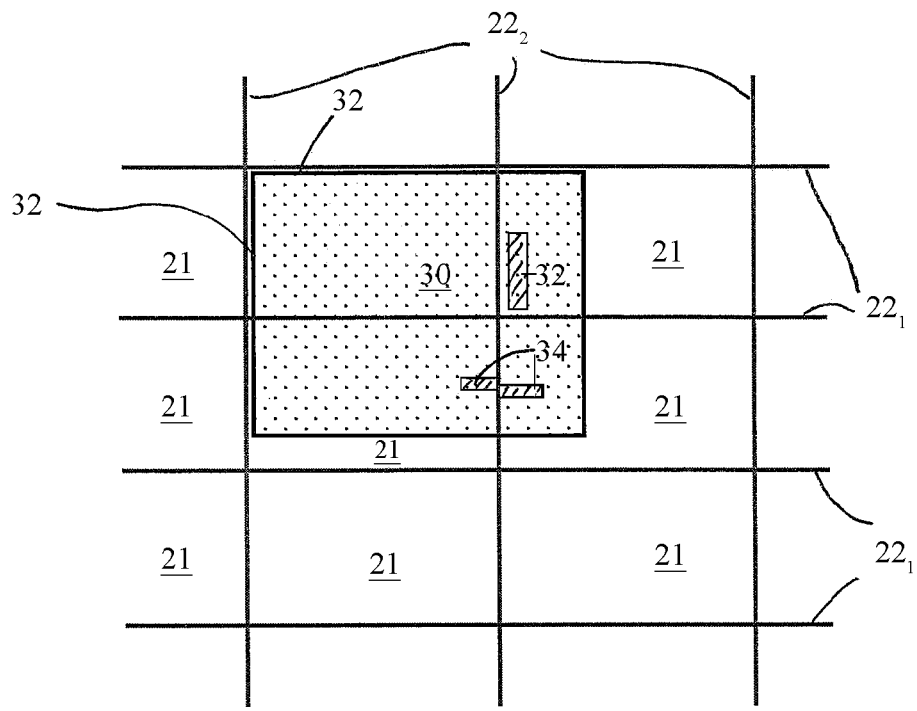
FIG. 3 illustrates the layout and placement of a custom circuit.

FIG. 3 illustrates a design scheme, wherein intellectual property (IP) 30 (which represents all of the IPs in wafer 10) is laid out and placed in wafer 10. Again, for a clear view, the top side and the left side of IP 30 are shown as slightly offset from grid lines $22_1$ and $22_2$, respectively, although they actually overlap each other. IP 30 may be a custom circuit whose layout is designed manually, and may have a rectangular shape, although it may also have any other shapes. IP 30 may include a plurality of features including, but not limited to, gate electrodes, diffusion regions, metal lines, vias, gate dielectrics, and the like. In an embodiment, when laying out the features in IP 30, particularly sensitive features (such as gate electrodes and metal lines having strict timing requirements), each of the features is laid out only in one grid cell 21, and does not cross any of grid lines 22. For example, FIG. 3 illustrates gate poly 32 (solid line) that is in only one grid cell 21. As a comparison, the layout of gate poly 34 is not desired in the embodiments of the present invention since it crosses grid lines $22_2$, and hence may incur stitching errors, as also shown in FIG. 3.

For features that are difficult to be laid out inside one grid cell 21, design-for-manufacture (DFM) methods may be used to reduce the likelihood of having problems. For example, the width of the sensitive features that cross grid lines 22 may be increased. Further, manufacture-for-design (MFD) methods may also be performed, for example, by making marks in the marker layer of the layout for the features that cross grid lines 22 so that the problem may be fixed through process means.

To ensure that the sensitive features in IP 30 do not cross grid lines 22, two guidelines may be followed. First, the two sides 32 of IP 30 need to overlap one of grid lines $22_1$ and one of grid lines $22_2$. For IPs that are smaller than grid cell 21, this guideline is adequate to prevent the features from crossing grid lines 22. However, for IP cells that are larger than grid cell 21, the features need to be carefully laid out not to cross grid lines 22, as discussed in the preceding paragraphs. By following both guidelines, it is ensured that whenever IP 30 is moved or copied to another location in wafer 10, the features in IP 30 will still not cross grid lines 22.

Figure 4:
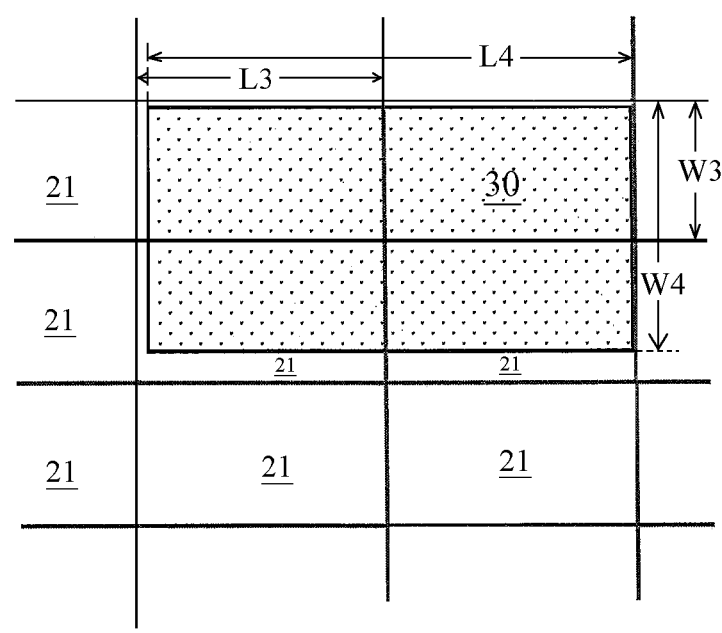
FIG. 4 illustrates the layout and placement of a flippable IP.

To increase the flexibility in the design, IP 30 may be laid out as being flippable, as is shown in FIG. 4. This may be achieved by allowing length L4 to be equal to an integer times the length L3 of grid cell 21. With such a design, if the features in IP 30 do not cross grid lines 22, IP 30 may be flipped left-to-right (with the right side flipped to the left, and the left side flipped to the right), and the features in IP 30 are still guaranteed not to cross grid lines 22. In addition, width W4 may be equal to an integer times the width W3 of grid cell 21. With such a design, IP 30 may be flipped top-to-bottom (with the top side flipped to the bottom side), and the features in IP 30 are also guaranteed not to cross grid lines 22. In alternative embodiments, IP 30 may be flippable both left-to-right and up-to-bottom. Again, this may be achieved by allowing length L4 equal to an integer times the length L3, and width W4 equal to an integer times the width W3.

Figure 5:
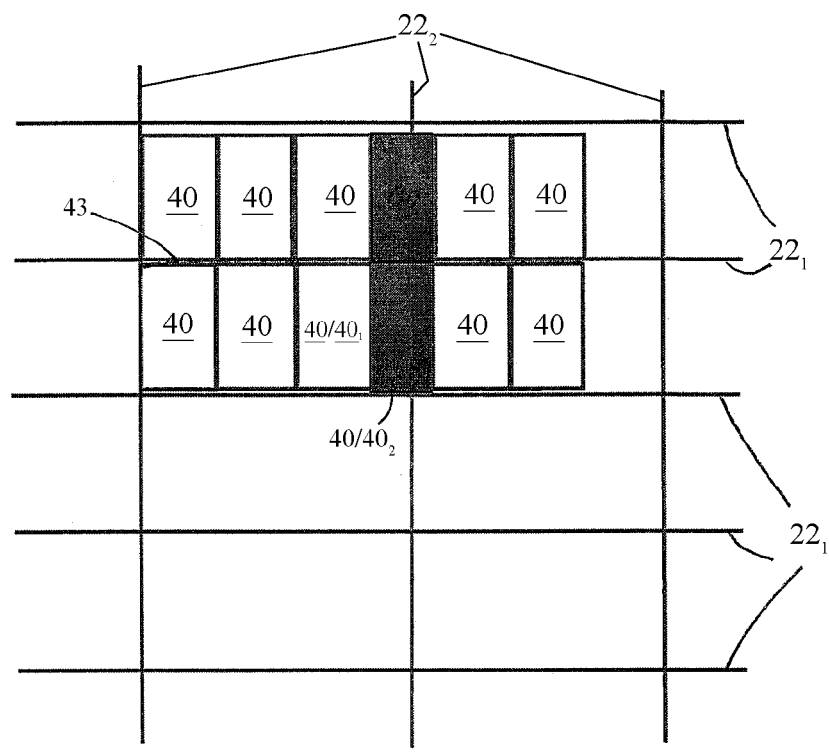
FIG. 5 illustrates the automatic placement of standard cells.

The design of the integrated circuits may include automatic placement of standard cells. Referring to FIG. 5, a plurality of standard cells 40 are automatically placed by a placer. Standard cells 40 may include sensitive cells whose performance is affected by the layout and the accuracy of the features in the sensitive cells. The sensitive cells include, but are not limited to, inverters, NAND gates, NOR gates, multiplexers, latches, flip-flops, and the like. Standard cells 40 may also include non-sensitive cells, including filler cells and decoupling-capacitor cells. As is known in the art, filler cells are used to connect power lines, well regions, and the like throughout rows, and hence are not critical to the performance of the integrated circuits. In an embodiment, the placer is applied with a constraint to place only non-sensitive cells crossing grid lines 22, whenever possible. For example, in FIG. 5, after the placer has placed critical cell $40_1$, and found that if another sensitive cell is placed to the right of, and adjoining critical cell $40_1$, the sensitive cell would cross one of grid lines $22_2$. This violates the constraint. Therefore, the placer automatically places filler cell $40_2$ to the right of critical cell $40_1$ to cross grid line 22. Further, in the placement of standard cells, interface 43 between two neighboring rows may overlap one of grid lines 22. Since the interface of the rows is typically where power lines are, and the power lines are typically wide, even a slight EBDW-related error (such as a stitching error) occurs, but the performance of the standard cells will not be affected.

Figure 6:
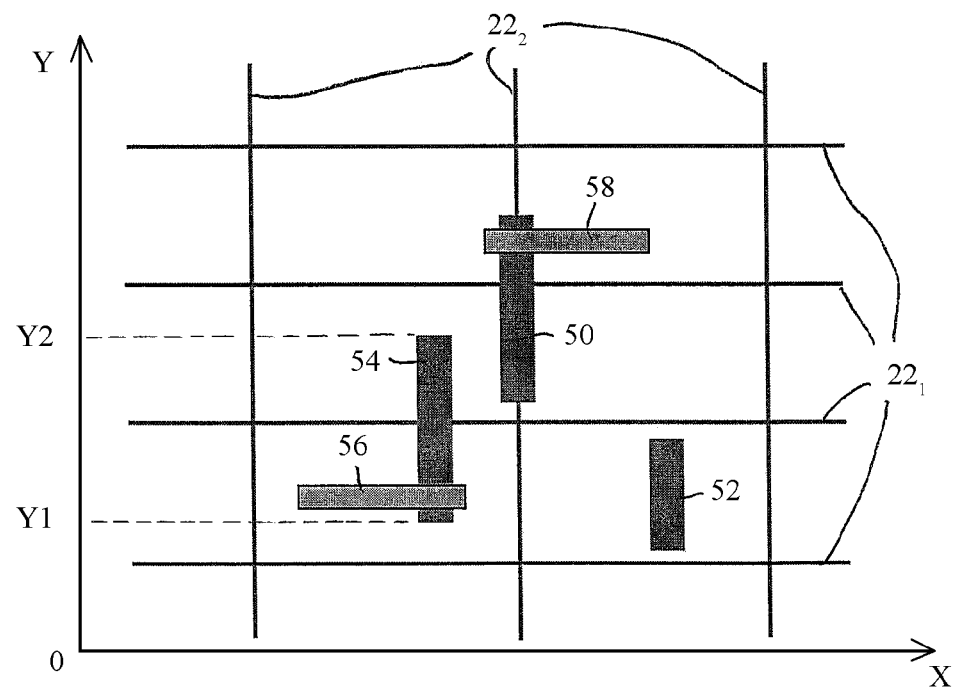
FIG. 6 illustrates the routing of metal lines.

FIG. 6 illustrates a scheme for constraining the routing of metal lines or other conductive lines, particularly sensitive conductive lines whose routing affects the performance (for example, the timing) of the respective integrated circuit. In an embodiment, during the routing, the router puts a weight on different possible routing lines, and weighs different weights to find a most preferred route. For example, conductive line 50 has the worst weight since it crosses both grid lines $22_1$ and $22_2$, and hence has the highest possibility of having EBDW-related errors. Conversely, conductive line 52 has the best weight since it does not cross any of grid lines 22. Conductive line 54 has a weight between that of conductive lines 50 and 52. Accordingly, the router will chose conductive line 52 over lines 50 and 54, and line 54 over line 50, whenever possible. Lines 50, 52, and 54 are in one metal layer whose preferred direction is Y direction. Similarly, in another metal layer whose preferred direction is X direction, metal lines 56 and 58 are also options of routing, and the router will chose line 56 over line 58 whenever possible. If a conductive line is a sensitive line, and crossing grid line 22 cannot be avoided, the conductive line may be moved to an upper metal layer to cross grid line 22. Since metal lines in upper layers are wider than the metal lines in underlying layers, the EBDW-related errors may be avoided. For example, conductive line 54 routes the connection from Y-coordinate Y1 to Y-coordinate Y2. If conductive line 54 is sensitive in metal layer M1, it can be moved to metal layer M3 to perform the same routing.

In the embodiments discussed in the preceding paragraphs, an EBDW system is first determined, and then grid 20 is determined based on the EBDW grids of the EBDW system. In alternative embodiments, a layout design may have already been made before an EBDW system is chosen. For example, the layout design may be made for a first EBDW system. However, a second EBDW system may be used to perform the EBDW on wafers. In this case, the grids of the second EBDW system, including the sizes of sub-fields, fields, and stripes of the second EBDW system may be adjusted to the same as the first EBDW system, or at least, to an integer times the respective sizes in the first EBDW system. Using this method, in the direct write, the errors may also be avoided.

Although the embodiments discussed in the preceding paragraphs refer to the direct write on wafers, the embodiments also apply to the formation of lithography masks that are used in the lithography processes, which masks comprise transparent portions allowing light to pass and opaque portions for blocking the light. The details are essentially the same as discussed in the preceding paragraphs. In the embodiments wherein the EBDW is performed on masks, the masks may then be used to form features on the wafers using photo-lithography processes so that the patterns on the masks are transferred to the wafers. The details of the photo-lithography processes are known in the art, and hence are not repeated herein.

The embodiments of the present invention have several advantageous features. By not allowing performance-sensitive features to cross grid lines on which the EBDW errors are most likely to occur, the EBDW-related errors may be substantially avoided. Therefore, the EBDW does not have to be performed slowly in a back-and-forth manner or by multiple exposures. The throughput is thus increased. A significance of the throughput improvement is that the EBDW have to be performed on each of the wafers, and hence the throughput improvement of the EBDW may occur to each of the wafers.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming integrated circuits for a wafer, the method comprising:
    providing an E-Beam direct write (EBDW) system;
    generating a first grid for the wafer, wherein the first grid comprises grid lines;
    wherein the grid lines of the first grid are synchronized with grid lines of a second grid of the EBDW system, so that at least potions of grid lines of the first grid are aligned to portions of grid lines of the second grid;
    wherein the second grid of the EBDW system comprises grids formed of boundaries of sub-fields of the EBDW system, and wherein the grid lines of the first grid overlap at least some of the boundaries of the sub-fields;
    laying out an integrated cicuit for the wafer, wherein substantially non-sensitive features in the integrated circuit are placed crossing the grid lines of the first grid and sensitive features in the integrated circuit are not placed crossing the grid lines of the first grid, and wherein the sensitive features belong to sensitive cells selected from the group consisting essentially of inverters, NAND gates, NOR gates, multiplexers, latches, flip-flops, and combinations thereof, and the non-sensitive standard cells are selected from the group consisting essentially of a filler cell and a decoupling-capacitor cell; and
    performing an EBDW on the wafer or a mask using the EBDW system.

2. The method of claim 1, wherein the EBDW is preformed on the wafer.

3. The method of claim 1, wherein the EBDW is preformed on the mask, and wherein the method further comprises
    performing a lithography process to form features on the wafer, wherein the features comprise patterns transferred from the mask.

4. The method of claim 1, wherein the EBDW system is a single-e-Beam direct write (EBDW) system.

5. The method of claim 1, wherein the EBDW system is a multiple-e-Beam direct write (EBDW) system.

6. The method of claim 1, wherein the step of laying out the integrated circuit comprises laying out a custom circuit, wherein a first boundary line and a second boundary line of the custom circuit overlap a first grid line and a second grid line in the grid lines, and wherein the first grid line and the second grid line are perpendicular to each other.

7. The method of claim 6, wherein at least one dimension selected from a group consisting essentially of a width and a length of the custom circuit is equal to multiple times a respective dimension of a grid cell in the first grid.

8. The method of claim 1, wherein the step of laying out the integrated circuit comprises performing an automatic placement of standard cells, and wherein substantially no sensitive cells in the standard cells are placed crossing the grid lines of the first grid.

9. The method of claim 1, wherein the grid lines of the first grid are synchronized with grid lines of a second grid of the EBDW system, so that at least portions of grid lines of the first grid are aligned to portions of grid lines of the second grid.

10. The method of claim 9, wherein the second grid of the EBDW system comprises grids formed of boundaries of sub-fields of the EBDW system, and wherein the grid lines of the first grid overlap at least some of the boundaries of the sub-fields.

11. The method of claim 1, wherein the second grid of the EBDW system comprises grids formed of boundaries of fields of the EBDW system, and wherein the grid lines of the first grid overlap at least some of the boundaries of the fields.

12. The method of claim 1, wherein the second grid of the EBDW system comprises grids formed of boundaries of stripes of the EBDW system, and wherein the grid lines of the first grid overlap at least some of the boundaries of the stripes.

13. The method of claim 1, wherein the step of laying out the integrated circuit comprises re-routing a metal line crossing one of the grid lines in a first metal layer to a second metal layer over the first metal layer.

14. The method of claim 1, wherein the step of laying out the integrated circuit comprises applying weights on metal lines inside grid cells of the first grid and metal lines crossing the grid lines, and laying out the metal lines based on the weights.

15. A method of forming integrated circuits for a wafer, the method comprising:
provinding an E-Beam direct write (EBDW) system;
determining a first grid comprising grid lines, wherein the first grid is synchronized with a second grid of the EBDW system, so that at least portions of grid lines of the first grid are aligned to portions of grid lines of the second grid;
wherein the grid lines of the first grid are synchronized with grid lines of a second grid of the EBDW system, so that at least potions of grid lines of the first grid are aligned to portions of grid lines of the second grid;
wherein the second grid of the EBDW system comprises grids formed of boundaries of sub-fields of the EBDW system, and wherein the grid lines of the first grid overlap at least some of the boundaries of the sub-fields;
applying the first grid on the wafer;
laying out a circuit for the wafer, wherein a first boundary and a second boundary of the circuit overlap a first grid line of the first grid and a second grid line of the first grid perpendicular to the first grid line, respectively;
wherein substantially non-sensitive features in the integrated circuit are placed crossing the grid lines of the first grid and sensitive features in the integrated circuit are not placed crossing the grid lines of the first grid, and wherein the sensitive features belong to sensitive cells selected from the group consisting essentially of inverters, NAND gates, NOR gates, multiplexers, latches, flip-flops, and combinations thereof, and the non-sensitive standard cells are selected from the group consisting essentially of a filler cell and a decoupling-capacitor cell; and
performing an EBDW on the wafer or a mask using the EBDW system.

16. The method of claim 15, wherein the EBDW is performed on the wafer.

17. The method of claim 15, wherein the EBDW is performed on the mask, and wherein the method further comprises
performing a lithography process to form features on the wafer, wherein the features comprise patterns transferred from the mask.

18. The method of claim 15, wherein sensitive features in the circuit substantially do not cross the grid lines of the first grid, and wherein the sensitive features belong to sensitive cells selected from the group consisting essentially of inverters, NAND gates, NOR gates multiplexers, latches, flip-flops, and combinations thereof.

19. The method of claim 15, wherein the sensitive features are selected from a group consisting essentially of gate electrodes, diffusion regions, metal lines, and combinations thereof.

20. The method of claim 15, wherein the second grid comprises grid lines selected from the group consisting essentially of boundaries between neighboring sub-fields of the EBDW system, boundaries between neighboring fields of the EBDW system, boundaries between neighboring stripes of the EBDW system, and combinations thereof.

21. The method of claim 15, wherein at least one of a dimension selected from the group consisting essentially of a width and a length of the circuit is equal to multiple times a respective dimension of a grid cell in the first grid.

22. The method of claim 21, wherein each of the width and the length of the circuit is equal to multiple times a respective width and a respective length of the grid cell.

23. The method of claim 15, wherein during the step of performing the EBDW, the grid lines of the first grid overlap at least portions of grid lines of the second grid.

24. A method of forming integrated circuits for a wafer, the method comprising:
providing an E-Beam direct write (EBDW) system;
determining a first grid comprising grid lines, wherein the first grid is synchronized with a second grid of the EBDW system;
wherein the grid lines of the first grid are synchronized with grid lines of a second grid of the EBDW system, so that at least potions of grid lines of the first grid are aligned to portions of grid lines of the second grid;
wherein the second grid of the EBDW system comprises grids formed of boundaries of sub-fields of the EBDW system, and wherein the grid lines of the first grid overlap at least some of the boundaries of the sub-fields;
applying the first grid on the wafer;
performing an automatic placement using a placer, wherein the placer is applied with a constraint to place non-sensitive standard cells on the grid lines of the first grid, and place sensitive standard cells that do not overlap with the grid lines of the first grid, and wherein the sensitive standard cells are selected from the group consisting essentially of an inverter, an NAND gate, a NOR gate, a multiplexer, a latch, a flip-flop, and combinations thereof, and the non-sensitive standard cells are selected from the group consisting essentially of a filler cell and a decoupling-capacitor cell; and performing the EBDW on the wafer using the EBDW system.

25. The method of claim 24, wherein an interface of two neighboring rows of the sensitive standard cells and non-sensitive standard cells overlap one of the grid lines.

26. The method of claim 24, wherein during the step of performing the EBDW, the grid lines of the first grid overlap at least portions of grid lines of the second grid.

* * * * *

UNITED STATES PATENT AND TRADEMARK OFFICE
CERTIFICATE OF CORRECTION

PATENT NO. : 8,214,773 B2  
APPLICATION NO. : 12/617470  
DATED : July 3, 2012  
INVENTOR(S) : Lu et al.

Page 1 of 1

It is certified that error appears in the above-identified patent and that said Letters Patent is hereby corrected as shown below:

In the Claims:

In Col. 6, line 42, claim 1, delete "potions" and insert --portions--.
In Col. 6, line 48, claim 1, delete "cicuit" and insert --circuit--.
In Col. 7, line 57, claim 15, delete "potions" and insert --portions--.
In Col. 8, line 56, claim 24, delete "potions" and insert --portions--.

Signed and Sealed this
Fourth Day of June, 2013

Teresa Stanek Rea
*Acting Director of the United States Patent and Trademark Office*